United States Patent
Hirabayashi

(10) Patent No.: US 12,217,805 B2
(45) Date of Patent: Feb. 4, 2025

(54) REFERENCE VOLTAGE GENERATING CIRCUIT AND SEMICONDUCTOR MEMORY DEVICE

(71) Applicants: Kabushiki Kaisha Toshiba, Tokyo (JP); Toshiba Electronic Devices & Storage Corporation, Tokyo (JP)

(72) Inventor: Osamu Hirabayashi, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 227 days.

(21) Appl. No.: 17/903,617

(22) Filed: Sep. 6, 2022

(65) Prior Publication Data

US 2023/0307067 A1    Sep. 28, 2023

(30) Foreign Application Priority Data

Mar. 24, 2022 (JP) .................. 2022-048992
Aug. 30, 2022 (JP) .................. 2022-136967

(51) Int. Cl.
| | | |
|---|---|---|
| G11C 16/30 | (2006.01) | |
| G05F 3/26 | (2006.01) | |
| G11C 16/26 | (2006.01) | |
| G11C 16/32 | (2006.01) | |

(52) U.S. Cl.
CPC .............. *G11C 16/30* (2013.01); *G05F 3/262* (2013.01); *G11C 16/26* (2013.01); *G11C 16/32* (2013.01)

(58) Field of Classification Search
CPC ...................................... G11C 16/30
USPC ...................................... 365/185.21
See application file for complete search history.

(56) References Cited

U.S. PATENT DOCUMENTS

| | | | |
|---|---|---|---|
| 11,499,874 B2* | 11/2022 | Park | G01K 7/01 |
| 2010/0195414 A1* | 8/2010 | Kim | G01R 19/16552 365/207 |
| 2012/0127784 A1 | 5/2012 | Tachibana | |
| 2019/0155323 A1* | 5/2019 | Kim | G01K 7/01 |
| 2021/0063250 A1* | 3/2021 | Park | G01K 7/01 |

FOREIGN PATENT DOCUMENTS

JP     2012-113769 A    6/2012

* cited by examiner

*Primary Examiner* — Muna A Techane
(74) *Attorney, Agent, or Firm* — Kim & Stewart LLP

(57) ABSTRACT

A reference voltage generating circuit according to an embodiment includes: an original reference voltage generating unit that generates an original reference voltage; and a reference voltage correcting unit that decreases the original reference voltage as the temperature rises and outputs the original reference voltage as a reference voltage to a sense amplifier, and thus it is possible to perform highly reliable operation while the influence of the temperature is reduced.

13 Claims, 3 Drawing Sheets

REFERENCE VOLTAGE GENERATING CIRCUIT AND SEMICONDUCTOR MEMORY DEVICE

CROSS-REFERENCE TO RELATED APPLICATIONS

This application is based upon and claims the benefit of priority from Japanese Patent Application No. 2022-048992, filed on Mar. 24, 2022 and Japanese Patent Application No. 2022-136967, filed on Aug. 30, 2022, the entire contents of which are incorporated herein by reference.

FIELD

Embodiments described herein relate generally to a reference voltage generating circuit and a semiconductor memory device.

BACKGROUND

In semiconductor memory devices, a sense amplifier is activated after a bit line has a potential sufficient for determining output of the sense amplifier at the time of data reading. A reference voltage of the sense amplifier is set so as to be able to absorb characteristic variations of transistors used in the sense amplifier and to reliably determine the level of a read signal at this point.

Meanwhile, a change in the potential of a read signal varies depending on the temperature such as the ambient temperature, and with the reference voltage of the sense amplifier being the same, when the value of a memory cell is "0", a read margin (difference between the level of a signal that is read and the level of a reference signal for determination) becomes smaller as the temperature becomes higher, and when the value of the memory cell is "1", a data read margin becomes smaller as the temperature becomes lower.

An object is to provide a reference voltage generating circuit and a semiconductor memory device capable of generating a reference voltage of a sense amplifier capable of performing a highly reliable operation by reducing an influence of temperature and increasing a read margin.

DETAILED DESCRIPTION

Hereinafter, a semiconductor memory device according to an embodiment will be described in detail with reference to the drawings.

Note that the present invention is not limited by these embodiments.

The reference voltage generating circuit according to the embodiment includes an original reference voltage generating unit that generates an original reference voltage and a reference voltage correcting unit that decreases the original reference voltage as the temperature rises and outputs the original reference voltage as a reference voltage to a sense amplifier.

Next, as an example of a semiconductor device, a NOR flash memory according to an embodiment will be described in detail.

Figure 1:
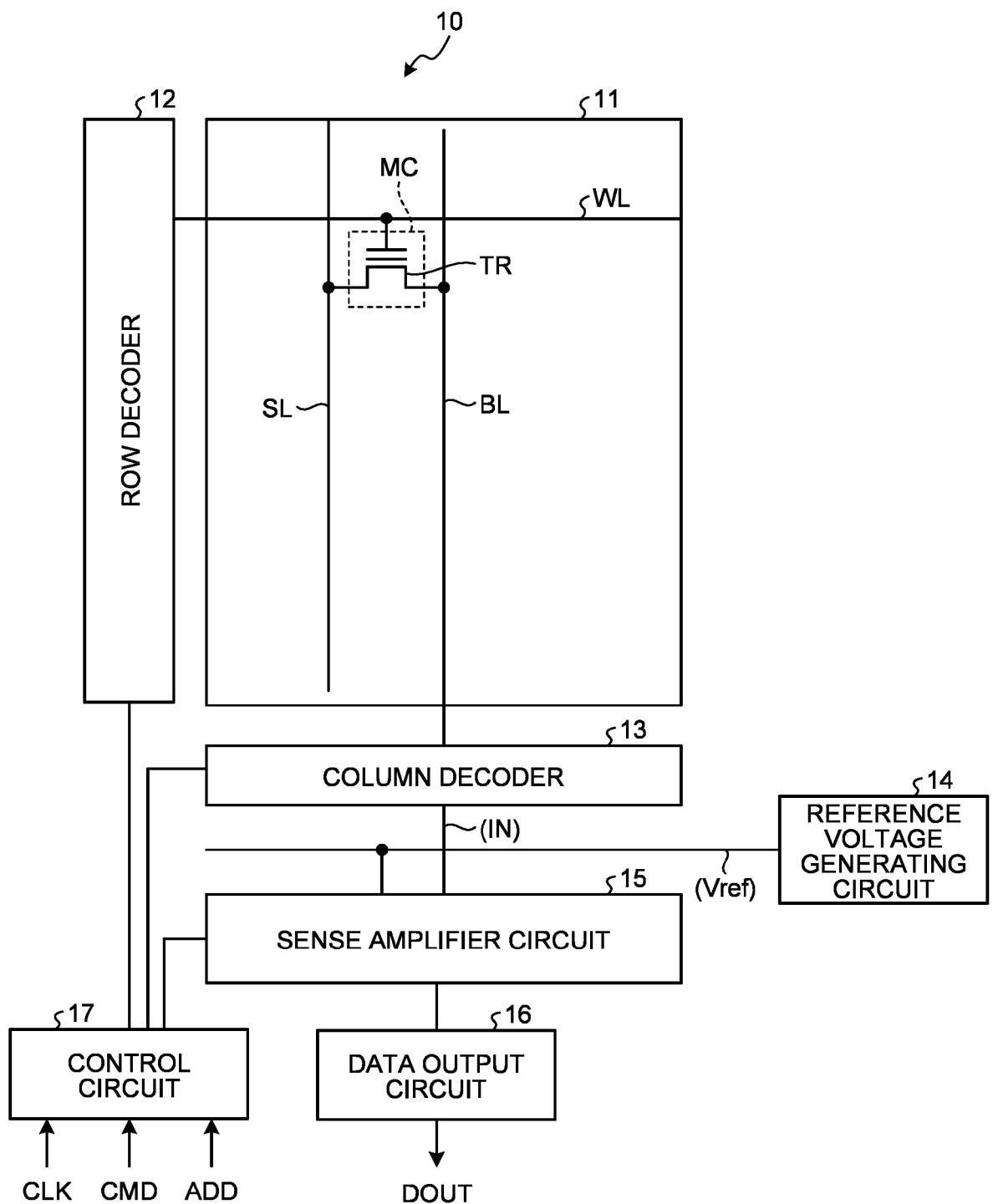
FIG. 1 is an explanatory diagram of a schematic configuration of a semiconductor memory device according to an embodiment.

FIG. 1 is an explanatory diagram of a schematic configuration of the semiconductor memory device according to the embodiment.

The semiconductor device 10 is configured as a NOR flash memory and includes a memory cell array 11, a row decoder 12, a column decoder 13, a reference voltage generating circuit 14, a sense amplifier circuit 15, a data output circuit 16, and a control circuit 17 as illustrated in FIG. 1.

The memory cell array 11 includes a plurality of memory cells MC arranged in a grid pattern.

The memory cell array also includes a plurality of word lines WL, a plurality of source lines SL, and a plurality of bit lines BL.

In FIG. 1, to facilitate understanding, only one memory cell MC in a selected state is displayed, and only the word line WL, the source line SL, and the bit line BL corresponding to the memory cell MC are displayed.

Note that a memory cell MC includes a memory cell transistor TR having a source terminal connected to a source line SL, a gate terminal connected to a word line WL, and a drain terminal connected to a bit line BL.

The row decoder 12 enables a word line WL corresponding to a memory cell MC to be read under the control of the control circuit 17.

The column decoder 13 enables a source line SL and a bit line BL corresponding to the memory cell MC to be read under the control of the control circuit 17.

The reference voltage generating circuit 14 generates and supplies a reference voltage to the sense amplifier circuit 15.

The sense amplifier circuit 15 compares the potential of the bit line corresponding to the memory cell MC in a selected state with the reference voltage at predetermined timing, determines data of the memory cell MC, and outputs the determination result to the data output circuit 16.

The data output circuit 16 outputs read data DOUT on the basis of the output of the sense amplifier circuit 15.

The control circuit 17 controls the row decoder 12, the column decoder 13, and the sense amplifier circuit 15 so as to write, read, or erase data to or from a corresponding memory cell MC on the basis of a clock signal CLK, command data CMD, and address data ADD from a host device (for example, MPU) not illustrated.

Next, the configuration of the sense amplifier circuit 15 will be described.

Figure 2:
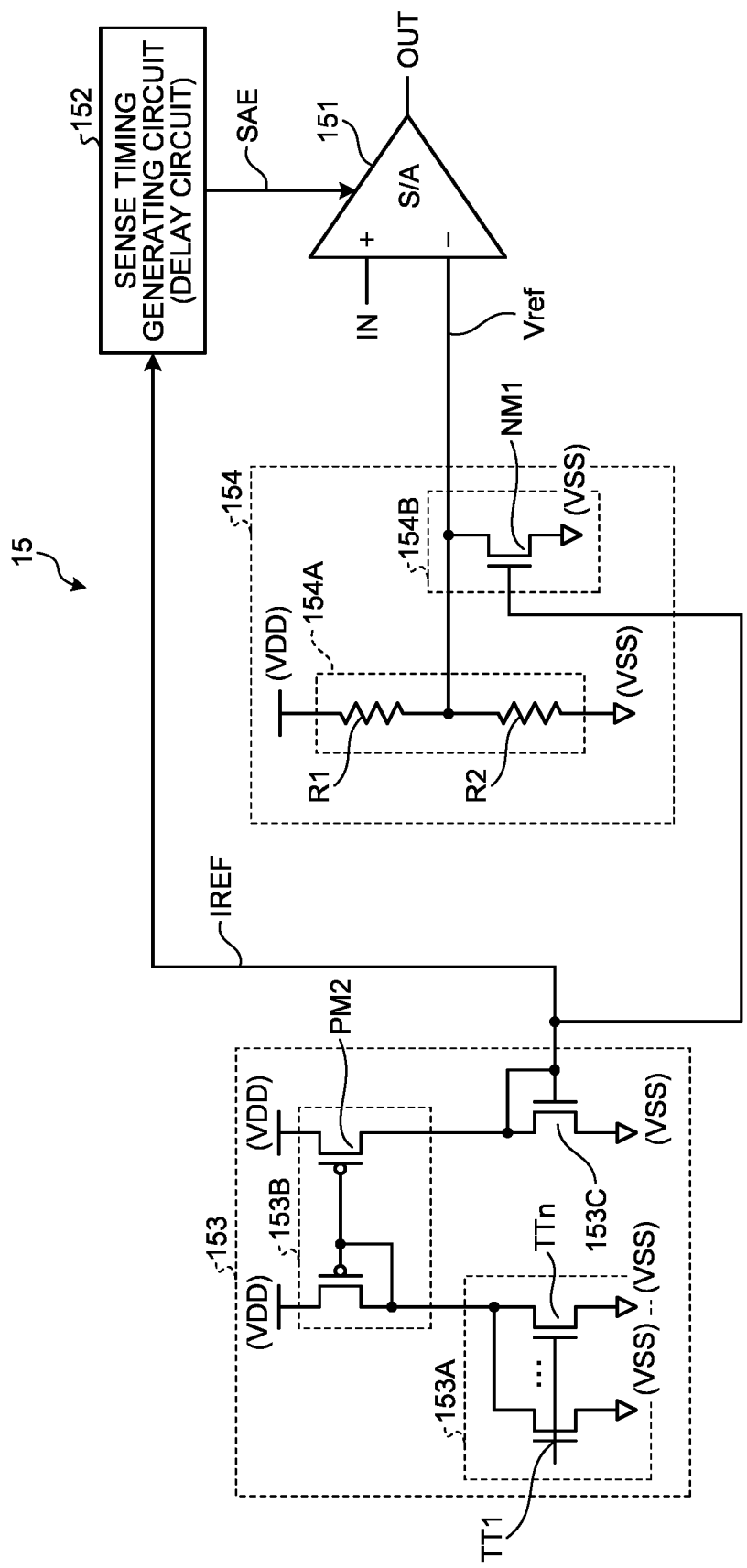
FIG. 2 is an explanatory diagram of a configuration example of the main part of a sense amplifier circuit.

FIG. 2 is an explanatory diagram of a configuration example of the main part of the sense amplifier circuit.

The sense amplifier circuit 15 includes a sense amplifier 151, a sense timing generating circuit 152, a reference current generating circuit 153, and a reference voltage generating circuit 154.

In this case, a sense amplifier 151 and a sense timing generating circuit 152 are included in each of a plurality of blocks BLK in correspondence therewith.

In this case, a sense timing generating circuit 152 can be shared by a plurality of sense amplifiers 151.

In the above configuration, the reference current generating circuit 153 generates a reference current control voltage IREF and outputs the reference current control voltage IREF to the sense timing generating circuit 152 and the reference voltage generating circuit 154.

The reference voltage generating circuit 154 generates a reference voltage Vref corresponding to the ambient temperature on the basis of the reference current control voltage IREF and outputs the reference voltage Vref to an inverting input terminal of the sense amplifier 151.

The sense timing generating circuit 152 includes one or a plurality of delay circuits (not illustrated) and outputs a sense amplifier enable signal SAE for enabling the sense amplifier 151 at timing corresponding to the current value of the reference current control voltage IREF input from the reference current generating circuit 153.

As a result, when an input signal IN from a bit line BL of each of the blocks BLK is input to a non-inverting input terminal, the reference voltage Vref is input to the inverting input terminal, and the sense amplifier enable signal SAE from the sense timing generating circuit 152 is enabled, the sense amplifier 151 outputs an output signal OUT at a "H" level in a case where the input signal IN has a voltage higher than or equal to the reference voltage Vref.

Alternatively, when the sense amplifier enable signal SAE from the sense timing generating circuit 152 is enabled and an input signal IN has a voltage less than the reference voltage Vref, the sense amplifier 151 outputs an output signal OUT at a "L" level.

The reference current generating circuit 153 roughly includes a current value setting unit 153A, a current mirror 153B, and a current source 153C.

The current value setting unit 153A includes n (n is an integer greater than or equal to 2) trimming N-channel MOS transistors TT1 to TTn connected in parallel, the number of which is variable by setting a gate terminal of which to the "H" level or the "L" level on the basis of trimming information read from a fuse or a flash memory.

The current mirror 153B includes a P-channel MOS transistor PM1 having a source terminal connected to the high-potential-side power supply VDD and a drain terminal connected to the current value setting unit 153A, the drain terminal and the gate terminal connected to each other, and a P-channel MOS transistor PM2 having a source terminal connected to the high-potential-side power supply VDD, a drain terminal connected to the current source 153C, and a gate terminal connected to the gate terminal of the P-channel MOS transistor.

The current source 153C includes an N-channel MOS transistor having a drain terminal and a gate terminal connected to each other (diode-connected).

In the above configuration, in the trimming N-channel MOS transistors TT1 to TTn, the drain-source current in an ON state is set so as to have a positive temperature coefficient, and the drain-source current increases as the temperature rises.

Moreover, a current flowing through the P-channel MOS transistor PM1 has a current value proportional to a current value of the current flowing through all trimming N-channel MOS transistors of which gates are set to the "H" level among the trimming N-channel MOS transistors TT1 to TTn of the current value setting unit 153A.

Therefore, a current value of the current flowing through the P-channel MOS transistor PM2, that is, the current value of the current at the reference current control voltage IREF is also proportional to the current value of the current flowing through all trimming N-channel MOS transistors of which gates are set to the "H" level among the trimming N-channel MOS transistors TT1 to TTn of the current value setting unit 153A.

Note that the reference current control voltage IREF functions as a control signal.

As a result, in the current value setting unit 153A, a reference current proportional to the number of trimming N-channel MOS transistors TT connected in parallel after trimming flows between the drain terminal and the source terminal of the P-channel MOS transistor PM1 of the current mirror 153B.

As a result, a current proportional to the number of trimming N-channel MOS transistors TT connected in parallel after trimming also flows between the drain terminal and the source terminal of the P-channel MOS transistor PM2 and is output to the sense timing generating circuit 152 as the reference current control voltage IREF functioning as a control signal.

In the sense timing generating circuit 152, the sense timing changes depending on the reference current control voltage IREF, and the sense timing is earlier as the reference current control voltage IREF is larger, and the sense timing is later as the reference current control voltage IREF is smaller. Trimming is set to each chip so as to achieve constant sense timing regardless of process variations, thereby adjusting the reference current control voltage IREF.

As a result, the sense timing generating circuit 152 receives the reference current control voltage IREF, in which process variations are absorbed, and enables the sense amplifier enable signal at timing corresponding to the current value of the current at the reference current control voltage IREF.

Next, the configuration of the reference voltage generating circuit 154 will be described.

The reference voltage generating circuit 154 includes an original reference voltage generating unit 154A that generates and outputs an original reference voltage Vref0 and a reference voltage correcting unit 154B that performs temperature compensation on the original reference voltage Vref0 on the basis of the reference current control voltage IREF and outputs the original reference voltage Vref0 as the reference voltage Vref to the inverting input terminal of the sense amplifier 151.

The original reference voltage generating unit 154A includes a resistor R1 having one end connected to the high-potential-side power supply VDD and a resistor R2 having one end connected to the other end of the resistor R1 and the other end connected to a low-potential-side power supply VSS and divides a differential voltage between the voltage of the high-potential-side power supply VDD and the voltage of the low-potential-side power supply VSS to output as the original reference voltage Vref0.

The reference voltage correcting unit 154B includes an N-channel MOS transistor NM1 having a drain terminal connected to a connection point between the resistors R1 and R2, a source terminal connected to a low-potential-side power supply VSS, and a gate terminal connected to the gate terminal of the N-channel MOS transistor included in the current source 153C.

In this case, the gate terminal of the N-channel MOS transistor NM1 is supplied with the reference current control voltage IREF as a control signal and applied with a bias voltage corresponding to the reference current control voltage IREF.

As a result, the N-channel MOS transistor NM1 enters the ON state corresponding to the bias voltage, pulls down the original reference voltage Vref0, and outputs the original reference voltage Vref0 as the desired reference voltage Vref to the inverting input terminal of the sense amplifier 151.

Next, the operation of the embodiment will be described.

First, prior to the operation of the embodiment, a problem of the related art will be described.

Figure 3:
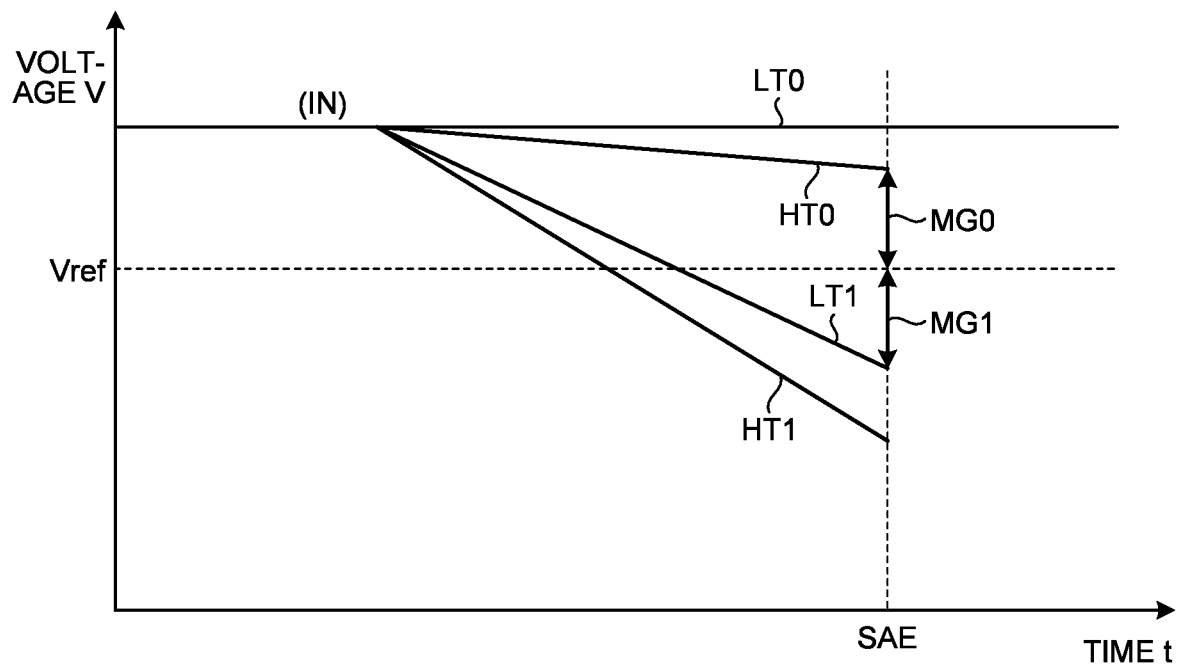
FIG. 3 is an explanatory graph of a problem of the related art.

FIG. 3 is an explanatory graph of a problem of the related art.

In a sense amplifier of the related art, a reference voltage input thereto is constant.

Meanwhile, in a case where reading is performed in a flash memory supporting a wide temperature range (for example, −40 to 175° C.), the fluctuation state of the read voltage varies depending on a value stored in a memory cell and the temperature.

More specifically, in a case where a threshold voltage Vth of a memory cell transistor TR included in the memory cell MC is high, the memory cell transistor TR remains in the OFF state even when the word line WL is in the "H" level, and the potential of the bit line BL remains substantially at the power supply potential.

However, the potential of the bit line BL gradually decreases slightly due to a leakage current of the memory cell transistor TR.

In general, a leakage current of a memory cell transistor TR tends to increase as the temperature rises. Therefore, as illustrated in FIG. 3, the higher the temperature is, the faster the decrease in the potential of the bit line BL when a value=0 stored in the memory cell MC is read.

Therefore, as the operating temperature range is higher, there is a possibility that a data read margin MG0 with respect to the reference voltage Vref becomes insufficient, and there is a possibility that data that has been read is an error.

On the other hand, in a case where the threshold voltage Vth of a memory cell transistor TR included in a memory cell MC is low, when the word line WL is in the high level, the memory cell transistor TR enters the ON state, an ON current flows from a bit line BL to a source line SL, and the potential of the bit line BL gradually decreases.

In general, since the ON current of a memory cell transistor TR tends to decrease as the temperature drops, the decrease in the potential of the bit line BL becomes slower as the temperature drops when a value=1 stored in the memory cell MC is read as illustrated in FIG. 3.

Therefore, as the operating temperature range is lower, there is a possibility that a data read margin MG1 with respect to the reference voltage Vref becomes insufficient, and there is a possibility that data that has been read is an error.

Next, the operation of the embodiment will be described again with reference to FIG. 2.

Figure 4:
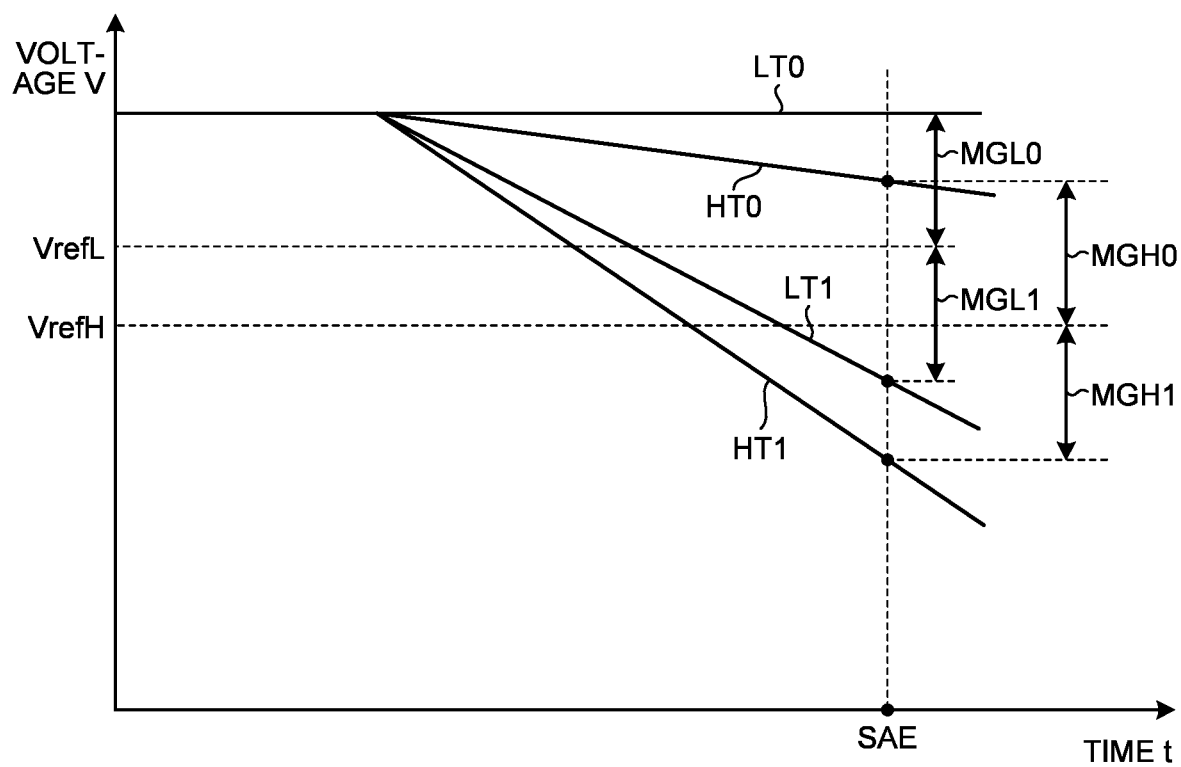
FIG. 4 is an operation explanatory graph of the embodiment.

FIG. 4 is an operation explanatory graph of the embodiment.

In this case, the reference voltage Vref output from the reference voltage generating circuit 154 is set to be lower as the temperature becomes higher.

That is, as illustrated in FIG. 4, a reference voltage VrefH in a case of a predetermined high temperature is lower than a reference voltage VrefL in a case of a predetermined low temperature.

More specifically, the drain-source currents in the ON state of the trimming N-channel MOS transistors TT1 to TTn increase as the temperature rises, and in a case where the temperature is higher than a predetermined reference temperature, the drain-source current has a current value higher than a current value at a predetermined reference temperature.

Therefore, the current value of the current flowing through the P-channel MOS transistor PM2, that is, the current value of the current at the reference current control voltage IREF is also higher than the current value at the predetermined reference temperature in a case where the temperature is higher than the predetermined reference temperature.

In parallel with this, the original reference voltage generating unit 154A of the reference voltage generating circuit 154 divides a voltage corresponding to a differential potential between the high-potential-side power supply VDD and the low-potential-side power supply VSS and generates and outputs the original reference voltage Vref0.

At this point, the reference voltage correcting unit 154B performs temperature compensation on the basis of the voltage corresponding to the reference current control voltage IREF and corrects the reference voltage Vref.

That is, the current value of the current at the reference current control voltage IREF is higher than the current value at the predetermined reference temperature in a case where the temperature is higher than the predetermined reference temperature and is lower than the current value at the predetermined reference temperature in a case where the temperature is lower than the predetermined reference temperature.

As a result, an on-resistance of the N-channel MOS transistor NM1 included in the reference voltage correcting unit 154B is lower than an on-resistance at the predetermined reference temperature in a case where the temperature is higher than the predetermined reference temperature and is higher than the on-resistance at the predetermined reference temperature in a case where the temperature is lower than the predetermined reference temperature.

Moreover, the reference voltage Vref output to the inverting input terminal of the sense amplifier 151 is given as the reference voltage VrefH for a high temperature, the reference voltage VrefH being lower than the reference voltage at the predetermined reference temperature in a case of a high temperature and is given as the reference voltage VrefL (>VrefH) for a low temperature, the reference voltage VrefL being higher than the reference voltage at the predetermined reference temperature in a case of a low temperature.

Therefore, in a case where the value=0 stored in a memory cell is read and the temperature is high, the reference voltage Vref=the reference voltage VrefH holds.

As a result, as illustrated in a signal waveform HT0 of FIG. 4, even in a case where a decrease in a read voltage due to a current flowing between a drain and a source of a transistor included in a memory cell to be read is large, a data read margin MGH0 from the reference voltage VrefH can be ensured to be sufficiently large at the timing when the sense amplifier enable signal SAE indicated by a vertical broken line in FIG. 4 is enabled, and the data that has been read does not become an error.

However, in a case where the reference voltage VrefH is too low, when the value=1 stored in the memory cell is read at a high temperature, the data read margin MGH1 decreases, and there is a possibility that the data that has been read becomes an error.

Therefore, in the present embodiment, it is ensured that the on-resistance of the N-channel MOS transistor NM1 included in the reference voltage correcting unit 154B is set to an appropriate value and that the data read margin MGH1 does not fall below the data read margin MGH0.

In addition, in a case where the value=1 stored in the memory cell is read and the temperature is low, the reference voltage Vref=the reference voltage VrefL holds.

As a result, as illustrated in a signal waveform LT1 of FIG. 4, even in a case where a decrease in the read voltage due to the current flowing between the drain and the source of the transistor included in the memory cell MC to be read is small, a data read margin MGL1 from the reference voltage VrefL can be ensured to be sufficiently large, and the data that has been read does not become an error.

As described above, according to the present embodiment, in a case where the temperature rises depending on the ambient temperature, the data read margin MGH0 for determination of the value=0 stored in the memory cell can be insured to be sufficiently large by decreasing the reference voltage Vref.

Alternatively, in a case where the temperature drops depending on the ambient temperature, the data read margin MGL1 for determination of the value=1 stored in the memory cell can be insured to be sufficiently large by increasing the reference voltage Vref.

Therefore, the reference voltage Vref can be optimized depending on the ambient temperature, and reliable determination can be stably performed.

However, in a case where the reference voltage VrefL is too high, when the value=0 stored in the memory cell is read at a low temperature, the data read margin MGL0 decreases, and there is a possibility that the data that has been read becomes an error.

Therefore, in the present embodiment, it is ensured that the on-resistance of the N-channel MOS transistor NM1 included in the reference voltage correcting unit 154B is set to an appropriate value and that the data read margin MGL0 does not fall below the data read margin MGL1.

In the above description, although the current value setting unit 153A includes the n (n is an integer greater than or equal to 2) trimming N-channel MOS transistors TT1 to TTn connected in parallel, it is also possible to set a current value by connecting a plurality of resistors having the same resistance value or a plurality of resistors having different resistance values (for example, resistance values of r, 2r, 4r, 8r, . . . ) in parallel and changing the combined resistance value of resistors to be connected to the current mirror 153B by trimming.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reference voltage generating circuit comprising:
   an original reference voltage generating unit that generates an original reference voltage; and
   a reference voltage correcting unit that decreases the original reference voltage as a temperature rises and outputs the original reference voltage that is decreased as a reference voltage to a sense amplifier, wherein
   the reference voltage correcting unit receives input of a control signal that varies as the temperature rises, and decreases the original reference voltage on a basis of the control signal, the control signal being input as a reference current control voltage for controlling enable timing of the sense amplifier.

2. The reference voltage generating circuit according to claim 1,
   wherein timing corresponding to a current value of a current accompanying application of the reference current control voltage is set as the enable timing.

3. The reference voltage generating circuit according to claim 2,
   wherein the current value of the current accompanying application of the reference current control voltage is higher than a current value at a predetermined reference temperature in a case where the temperature is higher than the predetermined reference temperature and is lower than the current value at the predetermined reference temperature in a case where the temperature is lower than the predetermined reference temperature.

4. The reference voltage generating circuit according to claim 1,
   wherein the reference voltage correcting unit sets the reference voltage to a high-temperature reference voltage lower than a first reference voltage at a predetermined reference temperature in a case where the temperature is higher than the predetermined reference temperature and sets the reference voltage to a low-temperature reference voltage higher than the first reference voltage at the predetermined reference temperature in a case where the temperature is lower than the predetermined reference temperature.

5. The reference voltage generating circuit according to claim 1,
   wherein the reference voltage correcting unit comprises a MOS transistor that pulls down the original reference voltage and sets the original reference voltage that is pulled down as the reference voltage, the MOS transistor being applied with the reference current control voltage at a gate terminal as a bias voltage.

6. A semiconductor memory device comprising:
   a memory cell that stores data;
   a bit line that transmits a signal read from the memory cell; and
   a sense amplifier circuit that detects data stored in the memory cell on a basis of the signal transmitted through the bit line,
   wherein the sense amplifier circuit comprises:
   a sense amplifier that compares the signal transmitted through the bit line with a reference voltage and outputs a data detection signal; and
   a reference current generating circuit that generates and outputs a reference current control voltage;
   a sense timing generating circuit that controls timing at which a sense amplifier enable signal, for enabling the sense amplifier, is output from an output terminal on a basis of the reference current control voltage; and
   a reference voltage generating circuit comprising an original reference voltage generating unit that generates an original reference voltage and a reference voltage correcting unit that decreases the original reference voltage as a temperature rises and outputs the original reference voltage that is decreased as the reference voltage.

7. The semiconductor memory device according to claim 6,
   wherein the reference voltage correcting unit decreases the original reference voltage as the temperature rises on a basis of the reference current control voltage.

8. The semiconductor memory device according to claim 6,
   wherein the reference current generating circuit comprises:
   a current value setting unit that varies a set current value by trimming; and
   a current mirror circuit that duplicates a current corresponding to the set current value set by the current value setting unit and outputs the current as the reference current control voltage.

9. The semiconductor memory device according to claim 7,
wherein the reference voltage correcting unit is applied with, as a control signal, a reference current control voltage for controlling enable timing of the sense amplifier.

10. The semiconductor memory device according to claim 9,
wherein the reference voltage correcting unit sets timing corresponding to a current value of a current accompanying application of the reference current control voltage as the enable timing.

11. The semiconductor memory device according to claim 10,
wherein the current value of the current accompanying application of the reference current control voltage is higher than a current value at a predetermined reference temperature in a case where the temperature is higher than the predetermined reference temperature and is lower than the current value at the predetermined reference temperature in a case where the temperature is lower than the predetermined reference temperature.

12. The semiconductor memory device according to claim 6,
wherein the reference voltage correcting unit sets the reference voltage to a high-temperature reference voltage lower than a first reference voltage at a predetermined reference temperature in a case where the temperature is higher than the predetermined reference temperature and sets the reference voltage to a low-temperature reference voltage higher than the first reference voltage at the predetermined reference temperature in a case where the temperature is lower than the predetermined reference temperature.

13. The semiconductor memory device according to claim 6,
wherein the reference voltage correcting unit comprises a MOS transistor that pulls down the original reference voltage and sets the original reference voltage that is pulled down as the reference voltage, the MOS transistor being applied with the reference current control voltage at a gate terminal as a bias voltage.

* * * * *